(12) United States Patent
Lee et al.

(10) Patent No.: US 6,521,360 B2
(45) Date of Patent: Feb. 18, 2003

(54) WHITE AND COLORED ORGANIC ELECTROLUMINESCENT DEVICES USING SINGLE EMITTING MATERIAL BY NOVEL COLOR CHANGE TECHNIQUE

(75) Inventors: Shuit-Tong Lee, Hong Kong (HK); Chun-Sing Lee, Hong Kong (HK); Zhi-Qiang Gao, Hong Kong (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 09/953,178

(22) Filed: Sep. 14, 2001

(65) Prior Publication Data

US 2002/0025419 A1 Feb. 28, 2002

Related U.S. Application Data

(63) Continuation of application No. 09/327,980, filed on Jun. 8, 1999, now abandoned.

(51) Int. Cl.[7] .............................................. H05B 33/00
(52) U.S. Cl. ....................... 428/690; 428/212; 428/917; 313/502; 313/506; 257/101
(58) Field of Search .................... 428/690, 917, 428/212; 313/502, 503, 504, 505, 506; 257/101

(56) References Cited

U.S. PATENT DOCUMENTS

| | | | | |
|---|---|---|---|---|
| 5,601,903 A | * | 2/1997 | Fujii et al. ................. | 428/212 |
| 5,683,823 A | | 11/1997 | Shi et al. .................. | 428/690 |
| 5,773,929 A | * | 6/1998 | Shi et al. .................. | 313/504 |
| 5,909,081 A | * | 6/1999 | Eida et al. ................. | 313/504 |
| 5,925,980 A | * | 7/1999 | So et al. ................... | 313/504 |
| 5,935,721 A | * | 8/1999 | Shi et al. .................. | 428/690 |
| 6,064,151 A | * | 5/2000 | Choong et al. ............. | 313/504 |
| 6,137,223 A | * | 10/2000 | Hung et al. ................ | 313/506 |
| 6,137,459 A | * | 10/2000 | Eida et al. ................. | 345/76 |
| 6,143,434 A | * | 11/2000 | Okada ....................... | 428/690 |
| 6,224,966 B1 | * | 5/2001 | Sakai et al. ................ | 428/212 |

FOREIGN PATENT DOCUMENTS

JP 06207170 * 7/1994

OTHER PUBLICATIONS

C.W. Tang, et al.; "Organic electroluminescent diodes"; *Appl. Phys. Lett.*; Sep. 1987; pp. 913–915.

* cited by examiner

Primary Examiner—Cynthia H. Kelly
Assistant Examiner—D. L. Garrett
(74) Attorney, Agent, or Firm—Merchant & Gould P.C.

(57) ABSTRACT

An organic electroluminescent device such as a light-emitting diode is disclosed, in which the emission layer comprises a single emitting material at different aggregate state to obtain constant chromaticity white emission. Correspondingly, a novel configuration has been developed to get white emission and color change in the organic EL devices.

16 Claims, 6 Drawing Sheets

WHITE AND COLORED ORGANIC ELECTROLUMINESCENT DEVICES USING SINGLE EMITTING MATERIAL BY NOVEL COLOR CHANGE TECHNIQUE

This application is a continuation of application Ser. No. 09/327,980, filed Jun. 8, 1999, now abandoned which application(s) are incorporated herein by reference.

FIELD OF THE INVENTION

This invention relates to organic electroluminescent (EL) devices. More particularly, the invention relates to the use of a single organic fluorescent material to obtain white emission or variable colors.

BACKGROUND OF THE INVENTION

Since Tang and Vanslyke have made the first thin film organic light-emitting diode by vacuum deposition (see Appl. Phys. Lett. Vol. 51, 1987, P. 913), there has been considerable interest in the use of organic materials for fabrication of organic light-emitting diodes (LEDs). As a result, more and more new materials, processing technologies, and cell configurations have been developed to improve the performance of the organic LEDs and obtain various emission color, especially white color for back-light and full color applications. Together with its wide viewing angle, high contrast, high brightness, and potentially low production cost, organic LEDs have a good potential for large-area flat panel display applications.

In a fundamental organic LED structure, one organic layer is specifically chosen to inject and transport holes and the other organic layer is specifically chosen to inject and transport electrons. The interface between the two layers provides an efficient site for the recombination of the injected hole-electron pair and resultant electroluminescence. The simple structure can be modified to a three-layer structure, in which an additional luminescent layer is introduced between the hole and electron transporting layer to function primarily as the site for hole-electron recombination and thus electroluminescence. In this respect, the functions of the individual organic layers are distinct and can therefore be optimized independently. Thus, the luminescent or recombination layer can be chosen to have a desirable EL color as well as a high luminance efficiency. Recently devices have been made with various configurations by inserting a luminescent layer, especially a multiluminescent layer with different luminescent materials, to obtain white emission or variable colors.

White organic LEDs are very important in full color displays and for back-lights of LCDs. In order to obtain white emission, the three basic colors red, green and blue need to be mixed together. Several methods have been employed to achieve white emission in organic LEDs. For example, multi emission layers may replace the single emission layer, with red, green, and blue emissions coming from the different emission layers, or RGB-emitting materials may be doped into a single polymer. In practice, however, it is very difficult to control the intensity ratio of the each RGB peak to obtain white emission. Furthermore, devices using the above methods will change chromaticity with the to driven voltage. Another approach for white emission is to use a white-emitting material that produces white emission by itself, but this is a substantial challenge for synthetic chemists.

SUMMARY OF INVENTION

It is an object of the present invention to disclose an organic LED in which single emitting material is used to obtain white emission.

It is another object of the present invention to provide a technique to obtain variable color emission in an organic EL devices by utilizing the aggregate property of the organic fluorescent materials.

According to the present invention there is provided an organic electroluminescent device comprising: a substrate formed of an electrically insulating material; an anode layer; an organic hole transporting layer; an organic electron transporting layer; an organic light emitting structure located between the hole transporting layer and the electron transporting layer, said light emitting structure comprising at least two sub-layers doped with the same fluorescent material at different concentrations; and a cathode layer.

The use of the aggregate property of organic fluorescent materials can change color of the organic EL device using single fluorescent materials. Different aggregate conditions of the fluorescent materials can emit different colors because of the interaction of the materials. As a result, using a structure for the light emitting layer in the organic EL devices which comprises different aggregates of the organic materials, white light emission can be obtained.

The substrate may be either optically transparent (eg plastics or glass) or opaque (eg semiconducting materials or ceramics). If the substrate is opaque, the anode may be transmissive and may be selected from the group consisting of a metal oxide, gallium nitride, zinc selenide and zinc sulphide. When the anode is a metal oxide it may be indium-tin-oxide, aluminium or indium doped tin oxide, magnesium-indium oxide, fluorine tin oxide, nickel-tungsten oxide and cadmium tin oxide. Conversely if the substrate is transparent, the anode may be opaque or transparent and formed of any material such as a metal or metallic compound provided that the work function is greater than 4.1 eV. Possible metals include gold, iridium, palladium and platinum.

The organic hole-transporting layer may be formed of a material including hole-transporting aromatic tertiary amine molecules.

To provide variable color properties the light emitting diode may comprise a light emitting structure comprising multiple sub-layers, each sub-layer comprising a different concentration of the fluorescent material. For example there may be from 2 to 5 sub-layers.

BRIEF DESCRIPTION OF THE DRAWINGS

Some embodiments of the invention will now be described by way of example and with reference to the accompanying drawings, in which.

DETAILED DESCRIPTION OF THE PREFERRED EMBODIMENTS

Figure 1:
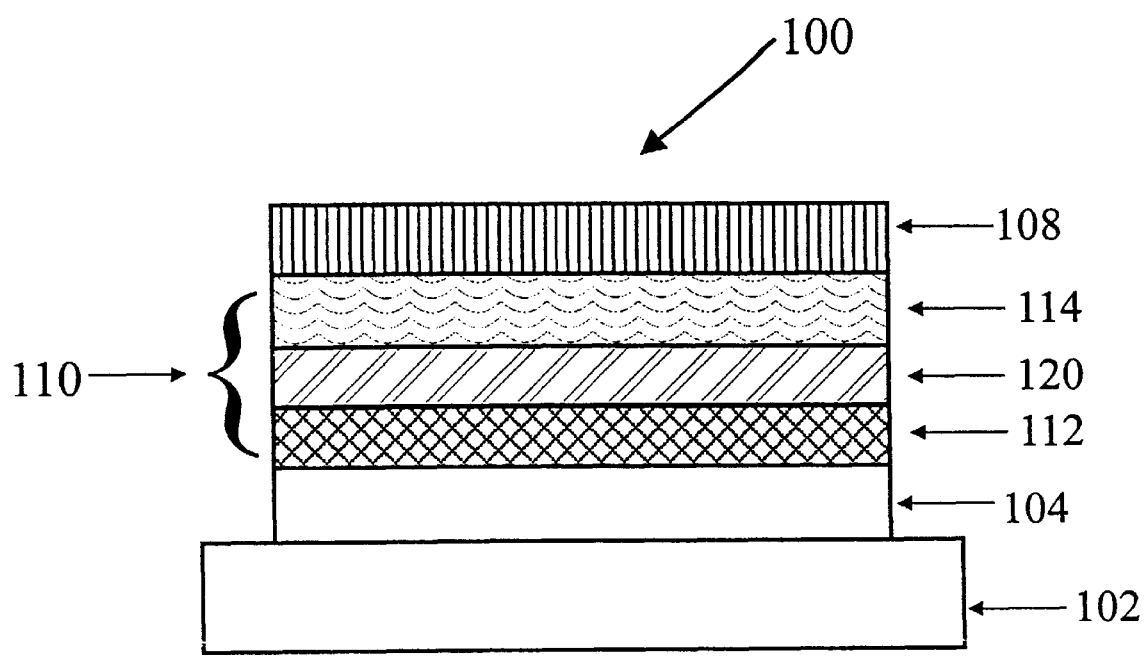
FIG. 1 is a schematic diagram of an embodiment of an organic LED accordance with the present invention.

Referring firstly to FIG. 1, an organic light-emitting device 100 comprises a substrate 102 on which is disposed an anode 104. An organic light-emitting structure 110 is formed between the anode 104 and a cathode 108. The organic light-emitting structure 110 is comprised of, an organic hole-transporting layer 112, an organic electron-transporting layer 114, and an organic light-emitting layer structure 120. When an electrical potential difference (not shown) is applied between the anode 104 and the cathode 108, the cathode will inject electrons into the electron-transporting layer 114, and the electrons will traverse the electron-transporting layer 114 and the light-emitting layer structure 120. At the same time, holes will be injected from the anode 104 into the hole-transporting layer 112. The holes will migrate across layer 112 and recombine with electrons in the light-emitting layer structure 120. As a result light is emitted from the organic LED.

The substrate 102 is electrically insulated and can either be light transmissive or opaque. The light transmissive property of a glass substrate or a plastic foil is desirable for viewing the EL emission through the substrate. For applications where the EL emission is viewed through the top electrode, opaque semiconductor and ceramic wafers can be used. Of course, it is necessary to provide in these device configurations a light transparent top electrode.

The anode 104 is formed of a conductive and transmissive layer. If it is desired to view the EL emission through the substrate, layer 104 should be transparent. For applications where the EL emission is viewed through the top electrode, the transmissive characteristic of the layer 104 is immaterial, and therefore any appropriate materials such as metals or metal compounds having a work function greater than 4.1 eV can be used. Possible metals include gold, iridium, molybdenum, palladium, and platinum. The conductive and transmissive layers can be selected from the group of metal oxides, nitrides such as gallium nitride, selenides such as zinc selenide, and sulphides such as zinc sulphide. Suitable metal oxides include indium-tin oxide, aluminum—or indium—doped zinc oxide, tin oxide, magnesium-indium oxide, nickel-tungsten oxide, and cadmium-tin oxide.

The hole transporting layer 112 of the organic EL device contains at least one hole transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monarylamine, diarylamine, triarylamine, or a polymeric arylamine. Exemplary monomeric triarylamines are illustrated by Klupfel et al U.S. Pat. No. 3,180,730. Other suitable triarylamines substituted with vinyl or vinyl radicals and/or containing at least one active hydrogen containing group are disclosed by Brantley et al U.S. Pat. Nos. 3,567,450 and 3,658,520.

Preferred materials for use in forming the electron transporting layer 114 of the EL devices of this invention are materials or mixtures of materials belonging to the benzazoles, such as 1,4-di(phenyl-2-benzimidazolyl) benzene (DPBI) and 1,3,5-tris(phenyl-2-benzimidazolyl)-benzene (TPBI), which have a high ionization potential and wide optical gap. Such compounds also exhibit high levels of performance and are readily fabricated in the form of thin layers.

Figure 2:
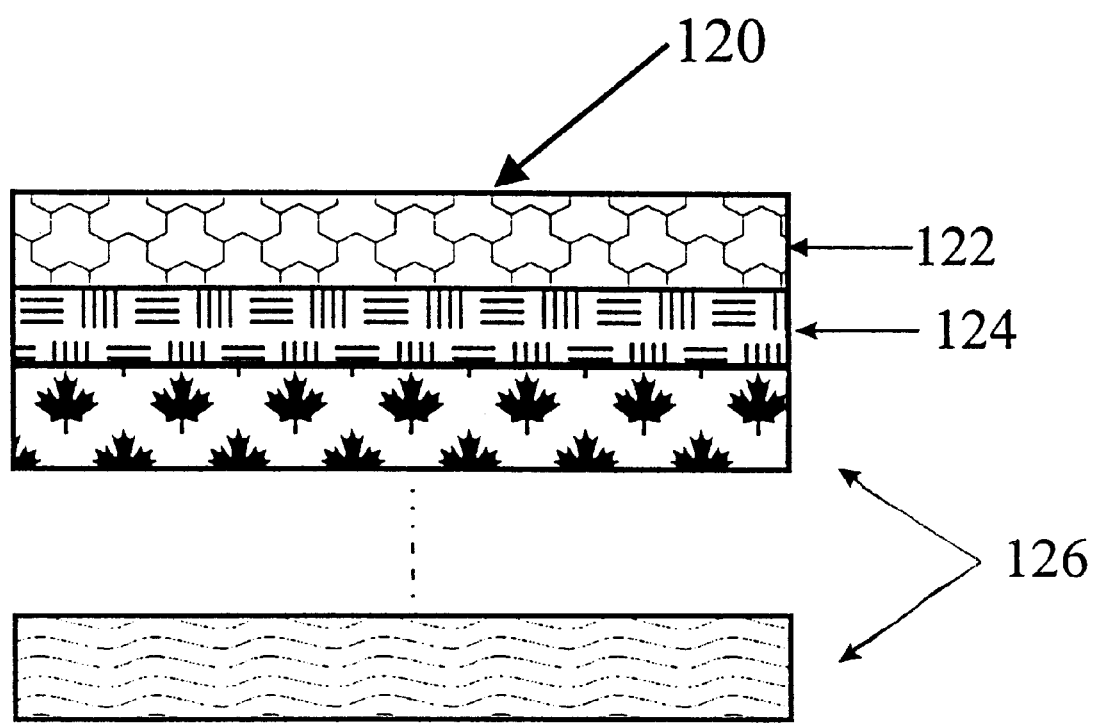
FIG. 2 is a schematic diagram of an embodiment of an organic LED in accordance with the present invention.

The luminescent layer 120 of the organic EL device comprises a luminescent or fluorescent material, where electroluminescence is produced as a result of electro-hole pair recombination in this region. In the prior art, the luminescent layer comprises a multi-component material consisting of a host material doped with one or more components of fluorescent dyes. In this invention, the luminescent layer is a multilayer structure whose sub-layers are doped with different concentrations of a single fluorescent dye. Turing to FIG. 2, a light emitting layer 120 comprises a first light emitting sub-layer 122, which may be either highly doped or non doped, where the light emission results from the aggregation state of the fluorescent dyes, the emission range being from 500 nm to 700 nm. The second light emitting sub-layer 124 is a low doped layer whose emission arises from the molecular structure of the fluorescent dyes, the emission range being from 400 nm to 550 nm. Further light emitting sub-layers comprising different doping concentrations of the same fluorescent dye can be added. Using this configuration, a broad emission, especially white light emission, can be obtained. Simultaneously, the color chromaticity of the EL devices is constant with increasing drive voltage.

EXAMPLES

The following examples are presented for a further understanding of the invention. For purpose of brevity, the materials and the layers formed therefrom will be abbreviated as given below:
ITO : indium tin oxide (anode)
TPD : N,N'-bis(3-methylphenyl)-N,N'-diphenylbenzidine (hole transporting layer)
DPBI: 1,4-di(phenyl-2-benzimidazolyl)-benzene (electron-transporting layer; functions here as a combined electron-transporting layer and host material)
PDBT : 2,2'-(p-phenylenedivinylene)bis-benzothiazole (fluorescent dye; functions here as a representative material to illustrate this invention)
Mg:Ag: magnesium:silver at a ration of 10:1 by volume (cathode)

Example 1 a) an ITO-coated glass was ultrasonically cleaned sequentially in a commercial detergent, iso-propanol, ethanol, and methanol, rinsed in deionized water, and then dried in an oven. The substrate was further subjected to a UV-ozone treatment for 10–20 minutes;

b) the substrate was put into a vacuum chamber, and the chamber was pumped down to $6 \times 10^{-6}$ mbar;

c) a 70 nm thick NPB hole-transporting layer was deposited on ITO;

d) a 3.5 nm thick PDBT emitting sub-layer was deposited on TPD layer;

e) a 30 nm thick DPBI:PDBT(2%) emitting sub-layer was deposited on PDBT layer;

f) a 30 nm thick DPBI electron-transporting layer was deposited on DPBI:PDBT(2%) layer;

g) a 200 nm thick MgAg layer was deposited on DPBI layer by co-evaporation from two sources (Mg and Ag).

Figure 3:
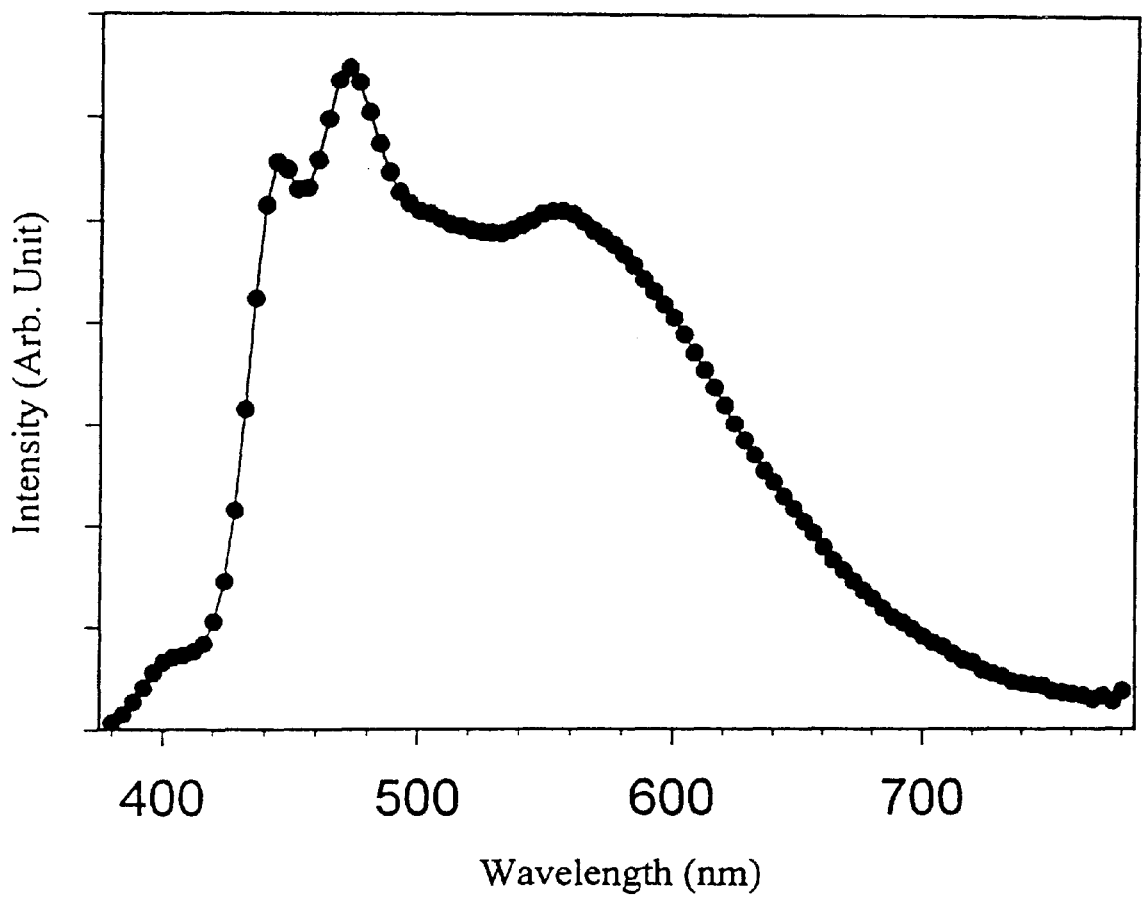
FIG. 3 is the emission spectrum of the organic LED prepared in example 1.
Figure 4:
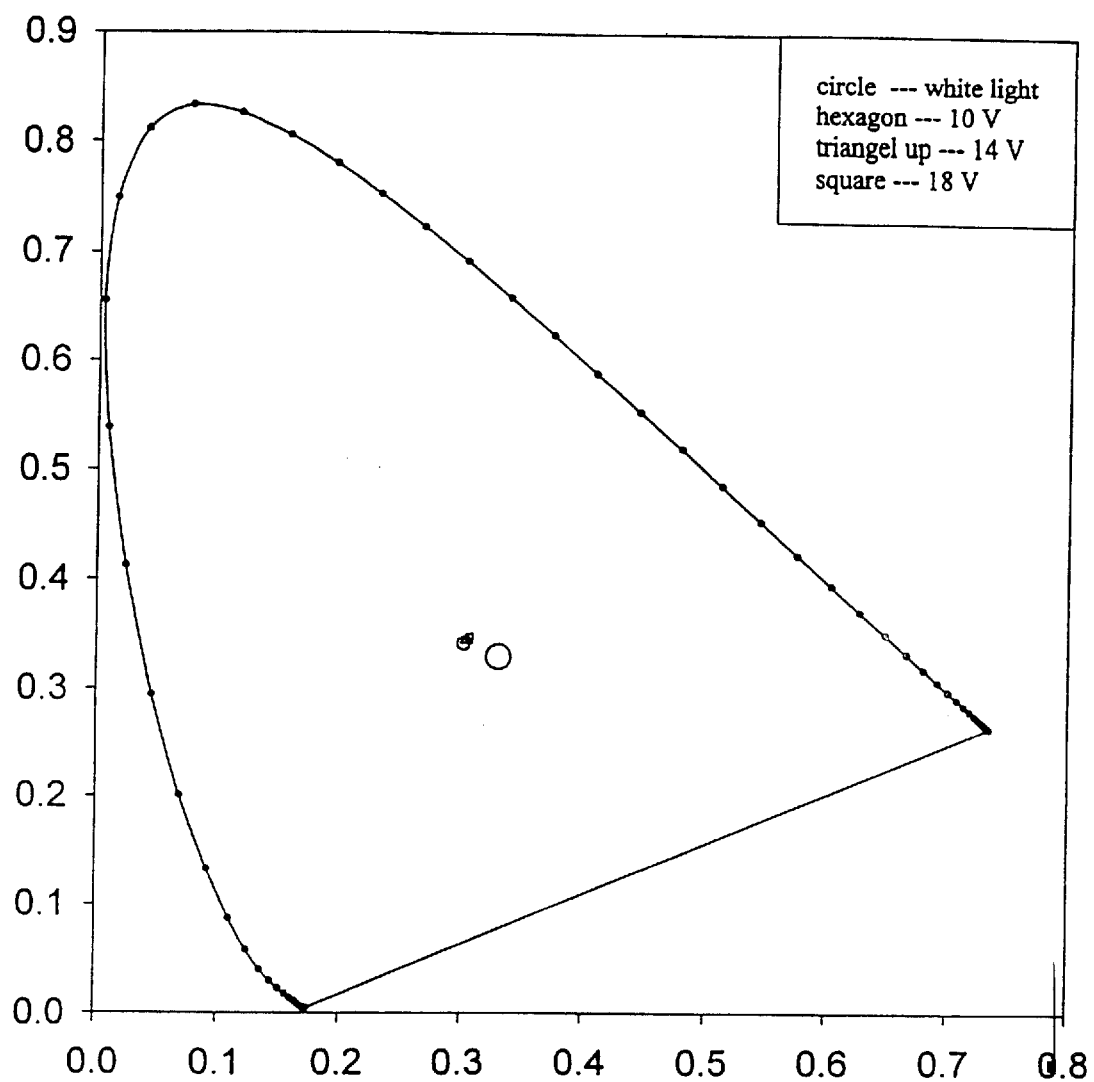
FIG. 4 is the CIE 1930 color coordinate of the organic LED prepared in example 1 at different driven voltages.

The electrical and optical properties of the device were characterized. The threshold voltage (define as the voltage at which the device emits light with a luminance of 1 cd/m$^2$) was determined to be 5.5 V. The luminance was 360 cd/m$^2$ at 20V, 160 mA/cm$^2$. The CIE 1930 is x=0.299,y=0.340. FIG. 3 shows the emission spectrum of the organic LED produced by this Example, and FIG. 4 shows the CIE 1930 color co-ordinate of the organic LED produced by this Example.

Example 2 a) an ITO-coated glass was ultrasonically cleaned sequentially in a commercial detergent, iso-propanol, ethanol, and methanol, rinsed in deionized water, and then dried in an oven. The substrate was further subjected to a UV-ozone treatment for 10–20 minutes;
b) the substrate was put into a vacuum chamber, and the chamber was pumped down to $5 \times 10^{-6}$ mbar,
c) a 70 nm thick NPB hole-transporting layer was deposited on ITO;
d) a 1.5 nm thick PDBT emitting sub-layer was deposited on TPD layer;
e) a 30 nm thick DPBI:PDBT(2%) emitting sub-layer was deposited on PDBT layer;
f) a 30 nm thick DPBI electron-transporting layer was deposited on DPBI:PDBT(2%) layer;
g) a 200 nm thick MgAg layer was deposited on DPBI layer by co-evaporation from two sources (Mg and Ag).

Figure 5:
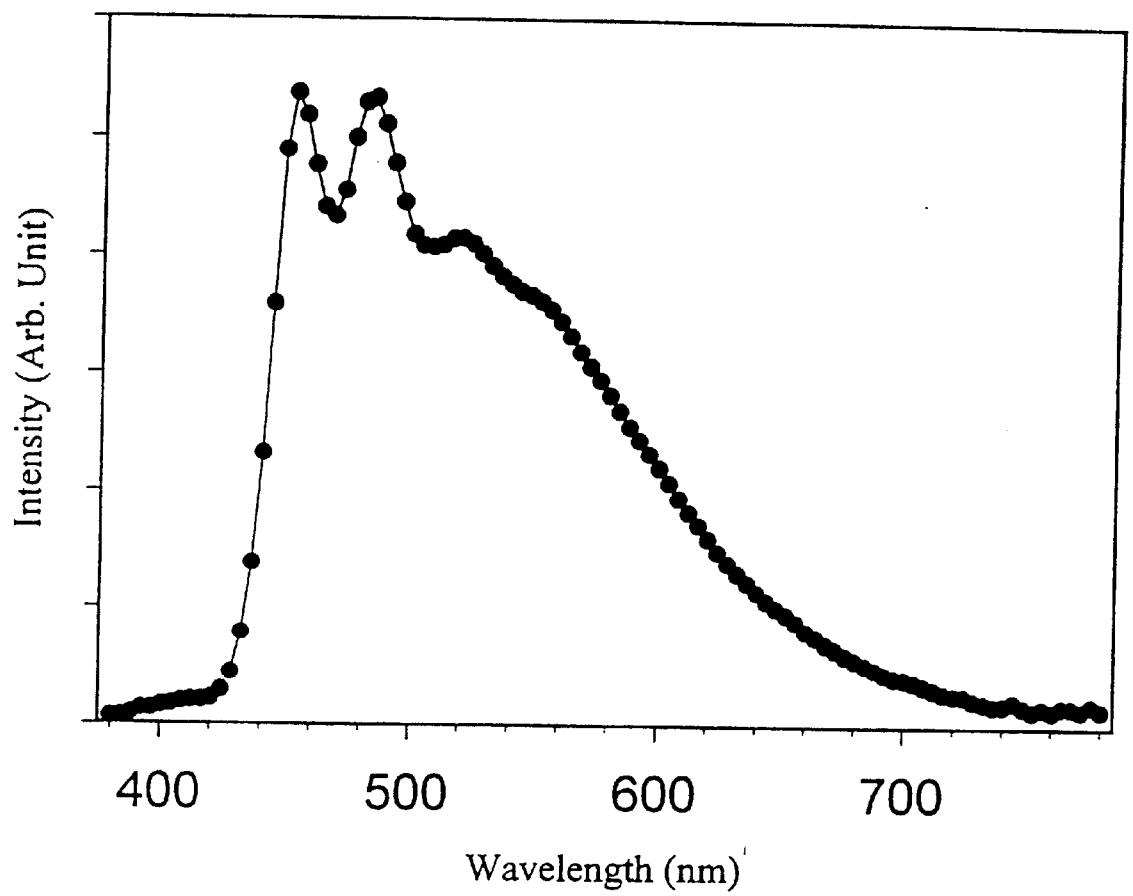
FIG. 5 is the emission spectrum of the organic LED prepared in example 2.

The electrical and optical properties of the device were characterized. The threshold voltage was determined to be 5.2 V. The luminance was 240 cd/m² at 20V, 165 mA/cm². The CIE 1930 is x=0.271,y=0.350. FIG. 5 shows the emission spectrum of the organic LED prepared in this Example.

Example 3 a) an ITO-coated glass was ultrasonically cleaned sequentially in a commercial detergent, iso-propanol, ethanol, and methanol, rinsed in deionized water, and then dried in an oven. The substrate was further subjected to a UV-ozone treatment for 10–20 minutes;
b) the substrate was put into a vacuum chamber, and the chamber was pumped down to $5 \times 10^{-6}$ mbar;
c) a 70 nm thick NPB hole-transporting layer was deposited on ITO;
d) a 30 nm thick DPBI:PDBT(2%) emitting sub-layer was deposited on TPD layer;
e) a 30 nm thick DPBI electron-transporting layer was deposited on DPBI:PDBT(2%) layer;
f) a 200 nm thick MgAg layer was deposited on DPBI layer by co-evaporation from two sources (Mg and Ag).

Figure 6:
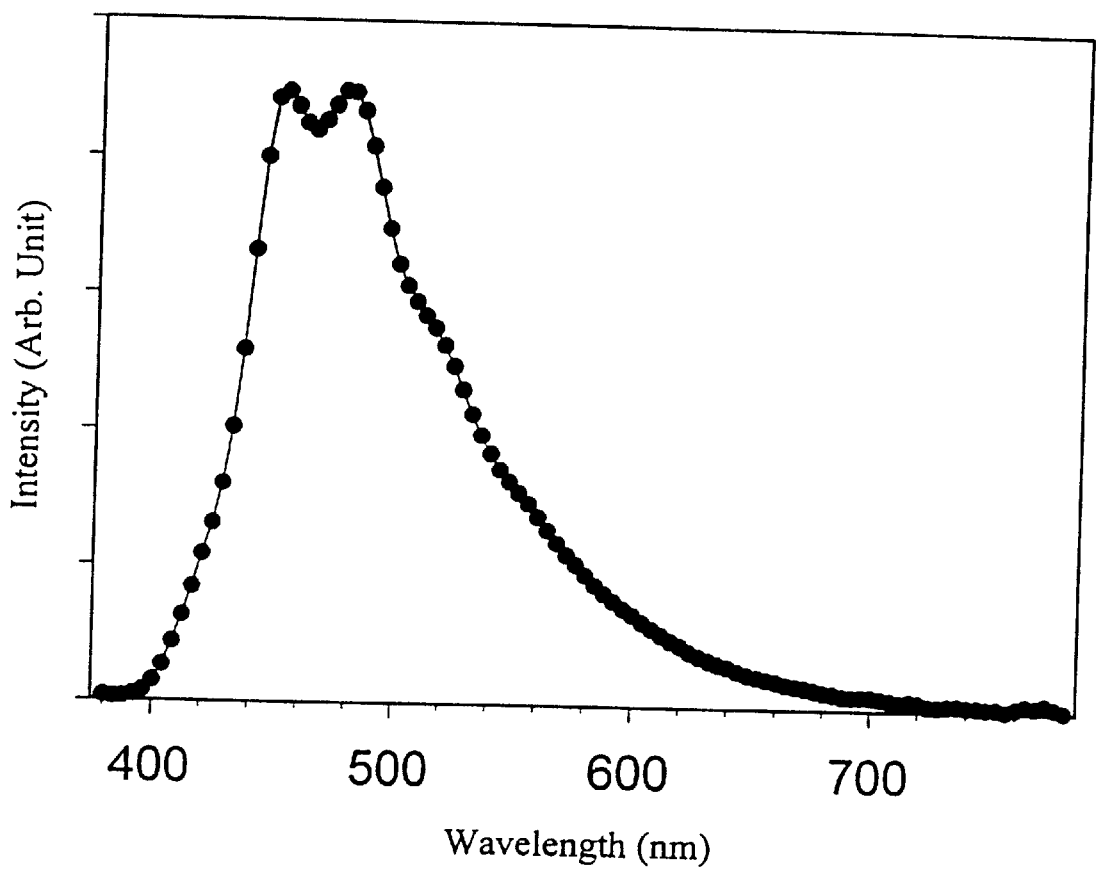
FIG. 6 is the emission spectrum of the organic LED prepared in example 3.

The electrical and optical properties of the device were characterized. The threshold voltage was determined to be 4.4 V. The luminance was 590 cd/m² at 18V, 175 mA/cm². The CIE 1930 is x=0.198,y=0.252. FIG. 6 shows the emission spectrum of the organic LED prepared in this Example.

The invention has been described in detail with particular reference to certain preferred embodiments thereof, but it will be understood that variations and modifications can be effected within the spirit and scope of the invention.

What is claimed is:
1. An organic electroluminescent device comprising:
a) a substrate formed of an electrically insulating material;
b) an anode layer;
c) an organic hole transporting layer;
d) an organic electron transporting layer;
e) an organic light emitting structure located between the hole transporting layer and the electron transporting layer, said light emitting structure comprising at least two sub-layers doped with the same fluorescent material at different concentrations;
f) a cathode layer.
2. An electroluminescent device as claimed in claim 1 wherein when the substrate is optically transparent.
3. An electroluminescent device as claimed in claim 2 wherein the substrate is formed from glass or plastics materials.
4. An electroluminescent device as claimed in claim 1 wherein when the substrate is opaque.
5. An electroluminescent device as claimed in claim 4 wherein the substrate is formed from ceramic or semiconducting materials.
6. An electroluminescent device as claimed in claim 1 wherein the anode is optically transmissive and selected from the group consisting of a metal oxide, gallium nitride, zinc selenide, and zinc sulphide.
7. An electroluminescent device as claimed in claim 6 wherein the metal oxide includes indium-tin oxide, aluminum or indium doped zinc oxide, tin oxide, magnesium-indium oxide, fluorine tin oxide, nickel-tungsten oxide, and cadmium-tin oxide.
8. An electroluminescent device as claimed in claim 1 wherein the anode is opaque and selected from the group consisting of a metal and a metallic compound having a work function greater than 4.1 eV.
9. An electroluminescent device as claimed in claim 4 wherein the anode is formed of a metal selected from the group consisting of gold, iridium, palladium, and platinum.
10. An electroluminescent device as claimed in claim 1 wherein the organic hole-transporting layer is formed of a material including hole-transporting aromatic tertiary amine molecules.
11. An electroluminescent device as claimed in claim 1 wherein the organic light-emitting layer structure comprises multiple groups of sub-layers, each sub-layer within a group comprising the same fluorescent dye doped at different concentrations.
12. An electroluminescent device as claimed in claim 11 comprising from 2 to 5 groups of sub-layers.
13. An electroluminescent device as claimed in claim 11 wherein the light emitting structure is from 1 to 40 nm thick.
14. An electroluminescent device as claimed in claim 1 wherein the fluorescent material comprises an organic fluorescent material the color of which depends on the degree of molecular aggregation.
15. An electroluminescent device as claimed in claim 1 wherein the electron-transporting layer is formed of a material selected from benzazoles or the group consisting of metal chelated oxinoid compounds.
16. An electroluminescent device as claimed in claim 1 wherein the cathode is formed of a material selected to have a work function less than 4.0 eV.

* * * * *